(12) United States Patent
Fukuda

(10) Patent No.: US 6,390,846 B2
(45) Date of Patent: May 21, 2002

(54) CONNECTOR CHECKER

(75) Inventor: Eiji Fukuda, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/745,997

(22) Filed: Dec. 26, 2000

(30) Foreign Application Priority Data

Dec. 27, 1999 (JP) ............................................ 11-370235

(51) Int. Cl.$^7$ ................................................ H01R 3/00

(52) U.S. Cl. .................................................... 439/488

(58) Field of Search ................................ 439/488, 452, 439/595, 491, 489; 29/593

(56) References Cited

U.S. PATENT DOCUMENTS 6,056,589 A * 5/2000 Endo et al. ................. 439/488

FOREIGN PATENT DOCUMENTS

JP 7-114963 5/1995

* cited by examiner

*Primary Examiner*—Tho D. Ta
*Assistant Examiner*—P Nguyen
(74) *Attorney, Agent, or Firm*—Armstrong, Westerman & Hattori, LLP

(57) ABSTRACT

The connector checker has a main body with a block accommodating a plurality of detection pins movable forward and backward in the block each for detecting an incorrect insertion state of a terminals which is inserted in a terminal accommodation chamber of a connector by inserting the detection pin into the terminal accommodation chamber. The checker main body has a plurality of through holes vertically elongated in section and a plurality of through holes horizontally elongated in section, and the vertically elongated through holes are disposed to partially overlap with the horizontally elongated through holes to define a plurality of rectangular openings. Through one of the rectangular openings, the detection pin is inserted so as to adequately limit vertical and horizontal movements of the detection pin within the terminal accommodation chamber.

3 Claims, 5 Drawing Sheets

CONNECTOR CHECKER

BACKGROUND OF THE INVENTION

1. Field of the Invention

The present invention relates to a connector checker for detecting an incomplete insertion state of a terminal inserted in a connector, particularly to a connector checker having a main body in which a detection pin can be inserted without an undesirable looseness to prevent damage of the detection pin.

2. Related Art

Referring to FIGS. 3 to 5, a known connector checker will be discussed hereinafter. FIG. 3 is a perspective view of a known connector checker. FIGS. 4A and 4B each are a sectional view showing an operation step of the connector the checker, and FIGS. 5A and 5B each are an enlarged view of FIG. 4A or 4B.

In FIG. 3, reference numeral 100 designates the connector checker having a base structure 10 provided with two guide shafts 50, 50. On the base structure, there are disposed a holder 20 and a checker main body 300 which are slidable along the guide shafts 50, 50.

The holder 20 is a frame holding a housing 81 of a connector 80 inspected therein, and each guide shaft 50 has a spring 60 mounted around it for resiliently urging the holder 20 toward the checker main body 300.

As illustrated in FIG. 3 and FIG. 4A, the checker main body 300 has an engagement recess 301 engageable with a forward portion of the housing 81 of the connector 80 and has a plurality of through holes 302 each associated with one of terminal accommodation chambers 82 of the connector 80.

As illustrated in FIG. 5A, each through hole 302 of the checker main body 300 accommodates a detection pin 40. Each detection pin 40 has a continuity sensing portion 40a and an incomplete insertion detection portion 40b in a forward side thereof. The detection pin 40 is resiliently biased by a spring 41 toward the holder 20.

The thus configured checker main body 300, as illustrated in FIGS. 4A and 4B, can be moved forward and backward by an actuation lever 70.

As illustrated in FIG. 3 and FIG. 5A, The connector 80 has the housing 81 formed with a plurality of the terminal accommodation chambers 82. Each terminal accommodation chamber 82 has a resilient locking arm 83 integrally formed therein.

The terminal accommodation chamber 82 receives a terminal 84 so that the locking arm 83 engages with a slit 84a formed in the terminal 84 to hold the terminal 84 within the terminal accommodation chamber 82.

Note that, when the terminal accommodation chamber 82 has incompletely received the terminal 84, that is, when the terminal 84 has been incompletely inserted therein, the locking arm 83 does not engages with the slit 84a of the terminal 84 as illustrated in FIG. 5B.

In the mean time, electrical wires 42, 85 (see FIG. 3) connected to the detection pin 40 or the terminal 84 are electrically connected to an electrical continuity checking apparatus (not shown). Thus, an operator uses the checking apparatus for detecting an incomplete insertion state or an incorrect continuity state of the terminal 84.

Next, referring to FIGS. 4A, 4B and FIGS. 5A, 5B, checking operations of the connector checker 100 will be discussed.

In FIGS. 4A and 5B, the holder 20 of the connector checker 100 receives the connector 80 to beset thereon, and pivoting the actuating lever 70 moves the checker main body 300 toward the connector 80.

Accordingly, as illustrated in FIG. 4B and FIG. 5B, the engagement portion 301 of the checker main body 300 engages with a forward portion of the connector 80, and each terminal accommodation chamber 82 of the connector 80 receives the associated detection pin 40.

In this state, when the terminal accommodation chamber 82 has completely received the terminal 84, the incomplete insertion detection portion 40b of the detection pin 40 has advanced under the locking arm 83. Thus, the continuity sensing portion 40a of the detection pin 40 contacts the terminal 84, so that the checking apparatus indicates a correct continuity state of the connector, for example by turning on a lamp.

Meanwhile, when the terminal accommodation chamber 82 has incompletely received the terminal 84, the incomplete insertion detection portion 40b of the detection pin 40 abuts against the locking arm 83, preventing the continuity sensing portion 40a of the detection pin 40 from contacting the terminal 84. Thus, the checking apparatus indicates an incorrect continuity state of the connector, for example by not turning on a lamp.

The known connector checker 100, as illustrated in FIG. 6, has the detection pin 40 which is rectangular in section, while the through hole 302 of the checker main body 300 is an elongated one slightly larger than the rectangular section of the detection pin 40. The elongated through hole 302 has an arc portion which allows looseness of the detection pin 40 within the through hole 302. Thus, at an engagement operation of the checker main body 300 with the connector 80, the detection pin 40 may abut an end wall of the housing 81, disadvantageously causing damage of the pin 40 or the end wall of the housing 81.

This problem may be eliminated by providing another through hole 302 of the checker main body 300 which has a rectangular section similar to the detection pin 40.

However, since the through hole 302 of the checker main body 300 is machined generally by a rotating cutter of an end mill, it is difficult to form the rectangular through hole 302 by using such a tool.

Furthermore, a plurality of the through holes 302 is machined to be formed one after another in the checker main body 300, so that the mutual distances of through holes 302 are not sufficient in precision, causing abutment of the detection pin 40 against the housing 81.

SUMMARY OF THE INVENTION

In view of the above-mentioned disadvantages, an object of the present invention is to provide a connector checker that can eliminate looseness of a detection pin within the checker main body. The checker allows an improved precise positioning of the detection pin, surely preventing damage of the detection pin.

For achieving the object, a connector checker according to the invention has a main body with a block accommodating a plurality of detection pins movable forward and backward in the block each for detecting an incorrect insertion state of a terminal which is inserted in a terminal accommodation chamber of a connector by inserting the detection pin into the terminal accommodation chamber. The checker main body has a plurality of through holes vertically elongated in section and a plurality of through holes horizontally elongated in section. The vertically elongated through holes are disposed to partially overlap with the horizontally elongated through holes to define a plurality of rectangular openings. Through one of the rectangular openings, the detection pin is inserted so as to adequately limit vertical and horizontal movements of the detection pin within the terminal accommodation chamber.

The thus configured checker has the vertically elongated holes disposed perpendicular to the horizontally elongated holes. Even when each elongated hole has each end of an arc shape, the plurality of rectangular openings can be defined each as corresponding to a sectional shape of the detection pin.

The detection pin is inserted through the rectangular opening, so that the vertical and horizontal movements of the detection pin is adequately limited to eliminate the undesirable looseness of the pin within the rectangular opening. This prevents the detection pin from abutting against the connector housing, causing no damage of the pin.

The method of defining a plurality of the rectangular openings by disposing the vertically elongated holes perpendicular to the horizontally elongated holes allows a greatly improved precise positioning of the rectangular openings than a known method in which through holes for detection pins are formed one after another. The improved method prevents damage of the pins during insertion thereof.

Preferably, the block of the checker main body is formed with the vertically elongated through holes or the horizontally elongated through holes, while a plate is formed with the horizontally elongated through holes or the vertically elongated through holes to define the rectangular openings. The vertically elongated through holes are parallel with each other, and the horizontally elongated through holes are parallel with each other. The plate is mounted on a surface of the block which has open ends of the elongated holes.

In the thus configure checker, the block or the plate may be replaced by another block or plate which has a different number of elongated holes, allowing to efficiently inspect various types of connectors having a different number of terminals.

Preferably, the elongated holes of the block may be separated from each other by partition walls, while the elongated holes of the plate are also separated by partition walls. The elongated holes of the block are disposed to abut against and perpendicular to the elongated holes of the plate to define the plurality of the rectangular openings.

In the thus configured checker, the rectangular opening is defined by four partition walls of the vertically elongated holes and the horizontally elongated holes, allowing a stable support of the detection pin.

DETAILED DESCRIPTION OF THE PREFERRED EMBODIMENT

Referring to the accompanied drawings, an embodiment of a connector checker according to the present invention will be discussed hereinafter.

Note that the connector checker according to the present invention is characterized in a checker main body which is different from the conventional one described in the prior art. The other parts of the connector checker, which are the same as those of the conventional checker, will not be discussed in detail again.

Figure 1A:
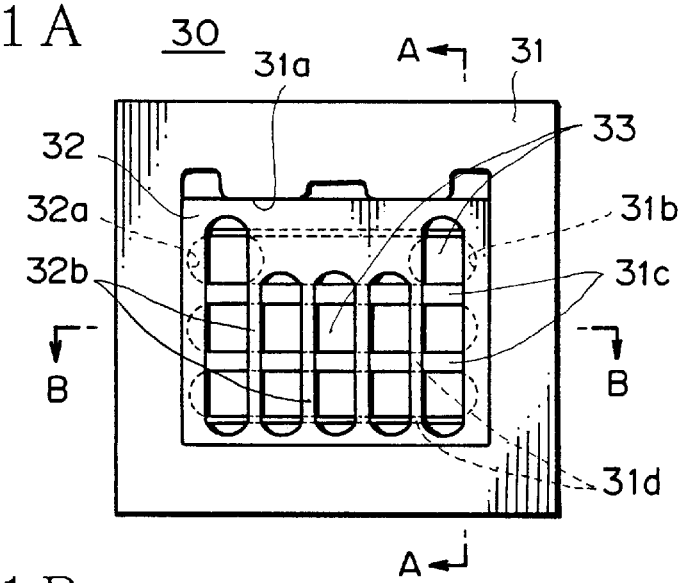
FIGS. 1A to 1C show a checker main body of a connector checker of an embodiment according to the present invention, which are sequentially a front view, a sectional view taken line A—A of FIG. 1A, and a sectional view taken along line B—B of FIG. 1A.
Figure 1B:
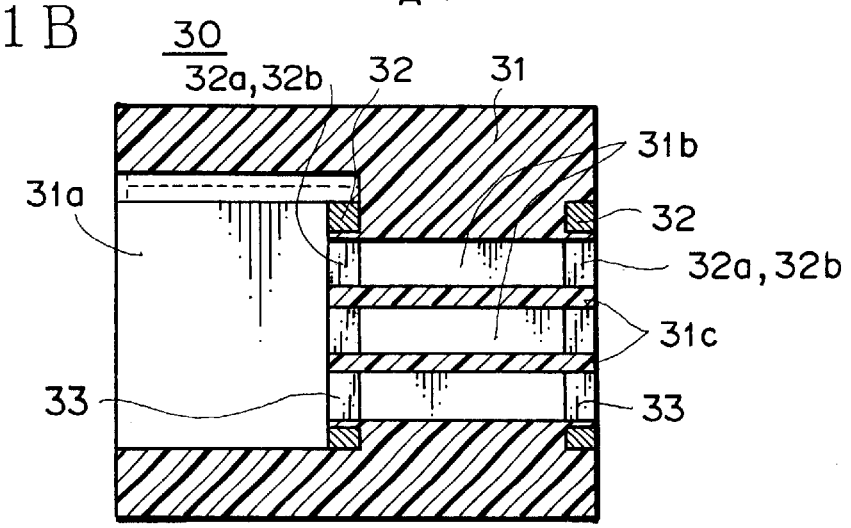
Figure 1C:
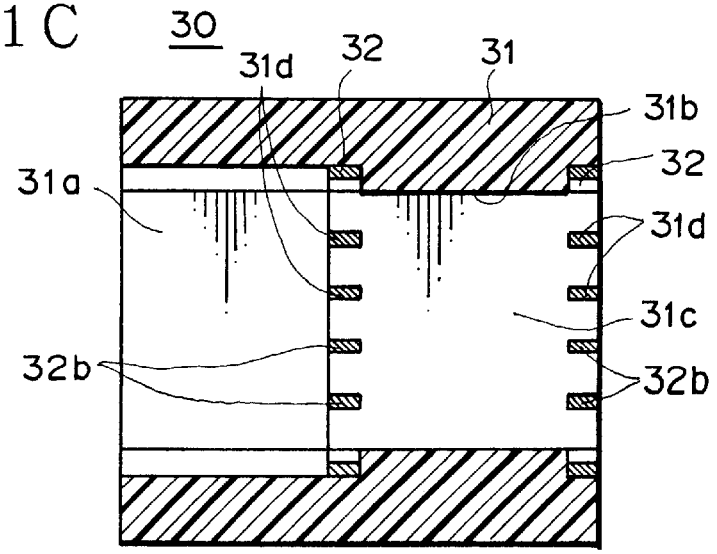
Figure 2A:
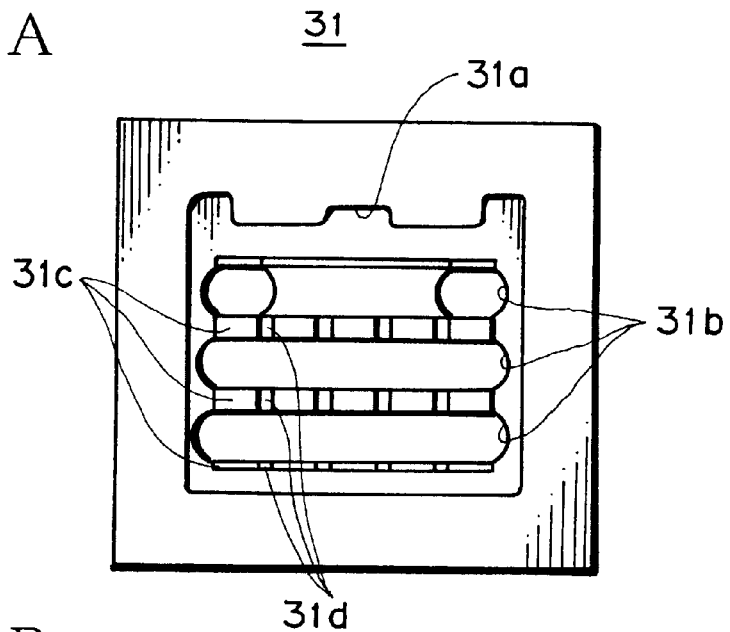
FIG. 2A is a front view showing a block constituting the checker main body.
Figure 2B:
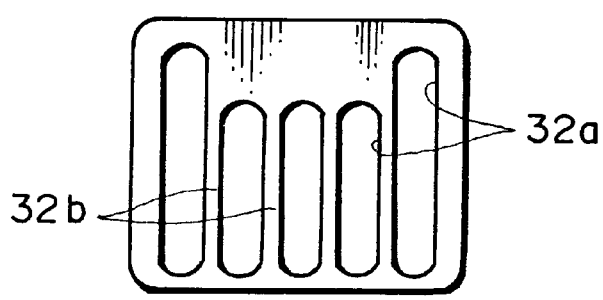
FIG. 2B is a front view showing a plate provided in the checker main body.
Figure 2C:
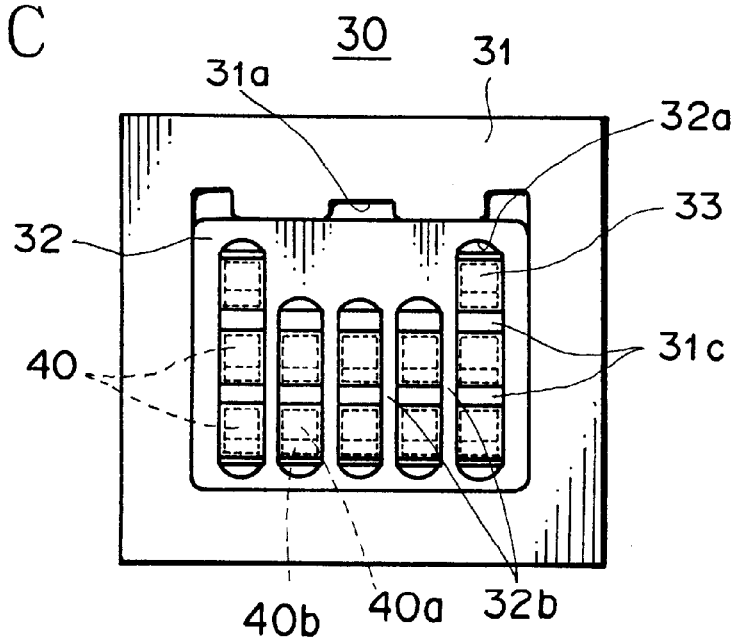
FIG. 2C is a front view showing the block assembled with the plate.

FIGS. 1A to 1C show a checker main body of a connector checker of an embodiment according to the present invention. FIGS. 2A to 2C show a block constituting the checker main body.

As illustrated in FIGS. 1A to 1C, a checker main body 30 has a block 31 and a pair of plates 32, 32.

Figure 3:
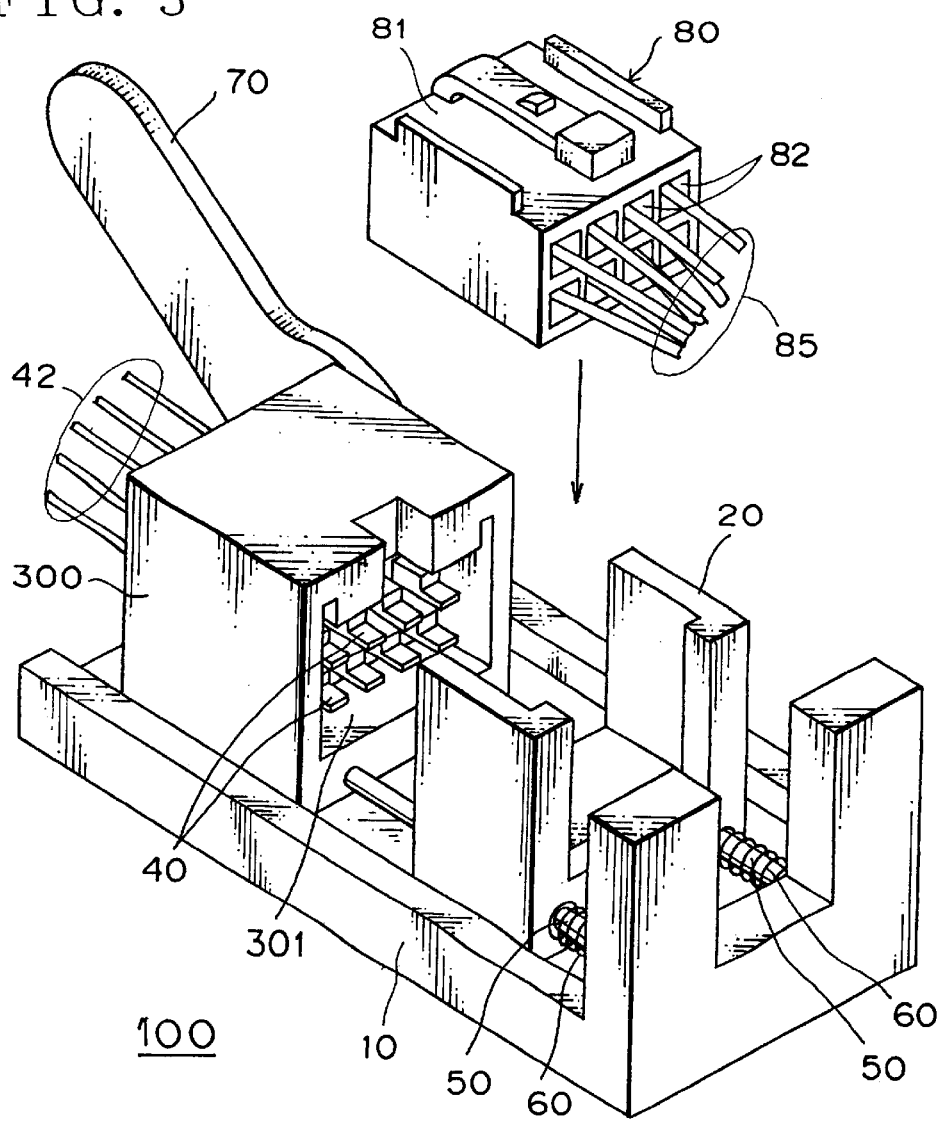
FIG. 3 is a perspective view of a known connector checker.
Figure 6:
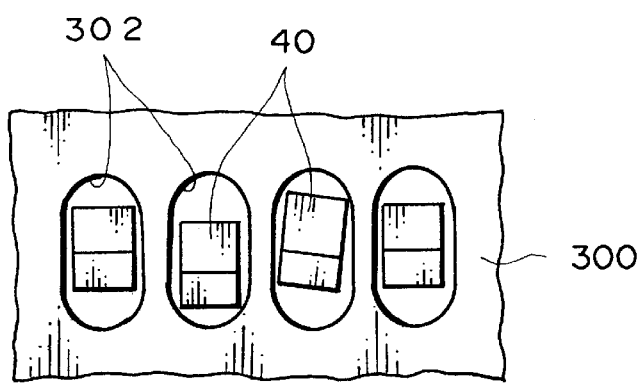
FIG. 6 is an enlarged front view showing detection pins and through holes receiving the pins of the known connector checker.

As illustrated in FIG. 2A, the block 31 has an engagement recess portion 31a engageable with a connector 80 (see FIG. 3) in a front surface of the block 31.

In an inner end surface of the engagement portion 31a, there are provided a plurality of holes 31b horizontally elongated in section. The holes 31b are parallel with each other and pass through a rear end surface of the block 31.

Each horizontally elongated hole 31b is defined by machining the block 31 with an end mill (not shown) having a rotating cutter. Thus, the elongated hole 31b has each end of an arc shape.

As illustrated in FIG. 2A and FIG. 2B, the horizontally elongated holes 31b are separated from each other by partition walls 31c. Each partition wall 31c is formed with a plurality of slits 31d at each longitudinal end thereof. Each slit 31d engages with an associated one of partition walls 32b (see FIG. 2B) of the plate 32.

As illustrated in FIG. 2B, each plate 32 is formed with a plurality of through holes 32a vertically elongated in section. The through holes 32a are parallel with each other.

In the same way as the horizontally elongated holes 31b, the vertically elongated holes 32a are defined by machining the plate 32 with an end mill having a rotating cutter. Thus, each vertically elongated hole 32a has each end of a circular arc shape.

As illustrated in FIG. 2B and FIGS. 1B, 1C, the partition walls 32b of each plate 32 engage the associated slits 31d of the partition walls 31c of the block 31, so that each plate 32 is secured respectively to a fore or rear end portion related to the horizontally elongated holes 31b.

This mounting of the plate 32 on the block 31, as illustrated in FIG. 1A and FIG. 2C, positions the vertically elongated holes 32a perpendicular to the horizontally elongated holes 31b, thereby defining a plurality of the rectangular openings 33 in conformity with the sectional shape of the detection pins 40.

To assemble the above-mentioned checker main body 30, first, the block 31 receives the pair of plates 32, 32 to define the plurality of rectangular openings 33. Next, each rectangular opening 33 is inserted by one of the detection pins 40.

Figure 4A:
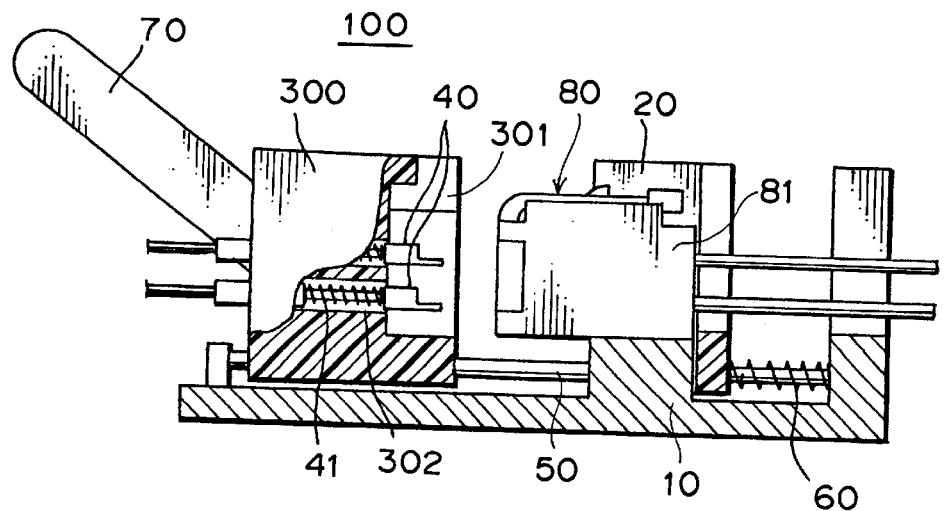
FIGS. 4A and 4B each are a sectional view showing an operation step of the known connector checker.
Figure 4B:
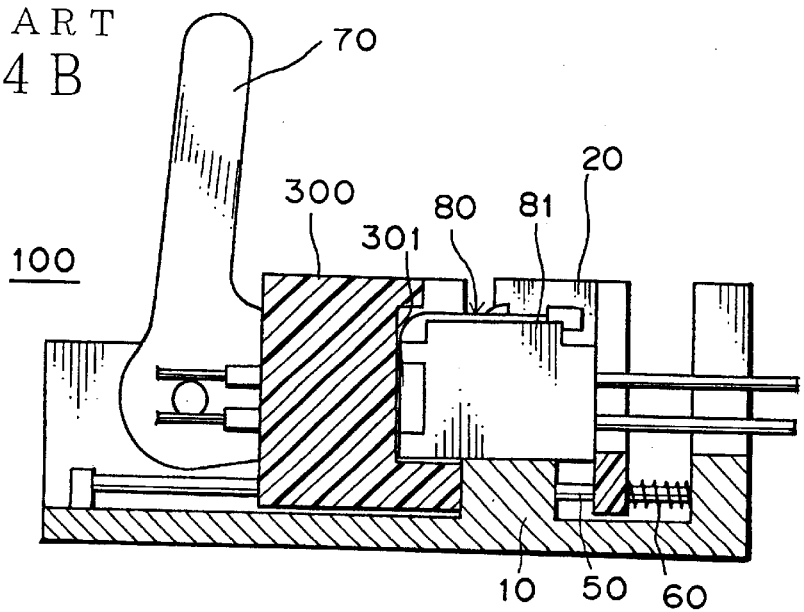
Figure 5A:
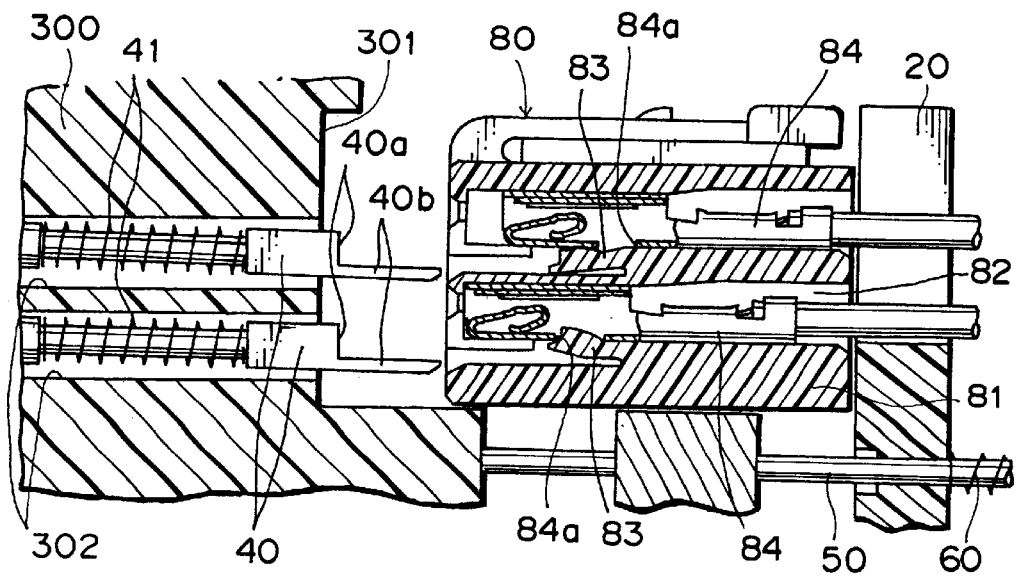
FIGS. 5A and 5B each are an enlarged view of FIG. 4A or 4B.
Figure 5B:
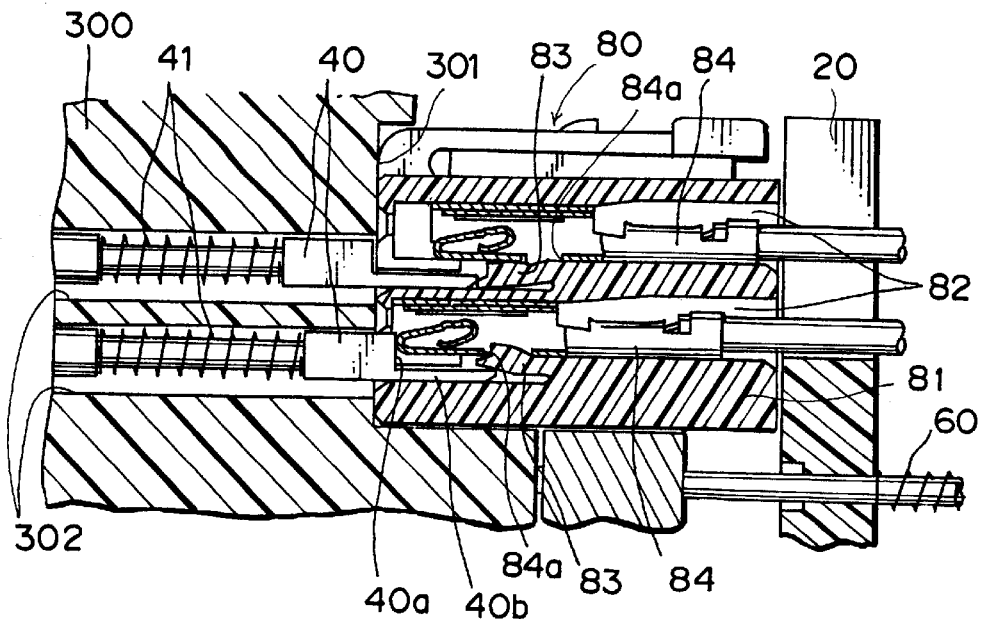

That is, after the provision of the rectangular openings 33, each detection pin 40 is inserted into each rectangular opening 33. The detection pin 40 is more smoothly mounted in the checker main body 30 than the prior-art one having the independently formed through holes 302 (see FIG. 4A).

The thus configured checker of the embodiment has the vertically elongated holes 32a disposed perpendicular to the horizontally elongated holes 31b. Even when each elongated hole 31b or 32a has each end of an arc shape, the plurality of the rectangular openings 33 can be defined each as corresponding to a sectional shape of the detection pin 40.

The detection pin 40 is inserted through the rectangular opening 33, so that the vertical and horizontal movements of the detection pin 40 is adequately limited to eliminate the undesirable looseness of the pin within the rectangular opening 33. This prevents the detection pin 40 from abutting against the connector housing 81 of the housing 81 (see FIG. 3), preventing damage of the pin 40.

The method of defining the plurality of rectangular openings 33 by disposing the vertically elongated holes 32a perpendicular to the horizontally elongated holes 31b allows a greatly improved precise positioning of the rectangular openings 33 than a known method in which the through holes 302 (see FIG. 4A) for the detection pins 40 are formed one after another. The improved method prevents damage of the pins 40 during insertion thereof.

In the thus configure checker, the block 31 or the plate 32 may be replaced by another block or plate which has a different number of elongated holes 31b, 32a, allowing to efficiently inspect various types of connectors having a different number of terminals.

Furthermore, in the embodiment, the partition walls 31c of the horizontally elongated holes 31b engage perpendicularly with the partition walls 32b of the vertically elongated holes 32a. Thus, the rectangular opening 33 is defined by four partition walls 31c, 32b of the vertically elongated holes 32a and the horizontally elongated holes 31b, allowing a stable support of the detection pin 40.

Note that a connector checker according to the present invention is not limited to the above-mentioned embodiments. For example, the block 31 of the checker main body 30 may have vertically elongated holes while the plate 32 has horizontally elongated holes.

What is claimed is:

1. A connector checker having a main body with a block accommodating a plurality of detection pins movable forward and backward in said block each for detecting an incorrect insertion state of a terminal which is inserted in a terminal accommodation chamber of a connector by inserting the detection pin into the terminal accommodation chamber in an insertion direction parallel to a direction of insertion of the terminals into the connector, wherein said checker main body has a plurality of through holes vertically elongated in section and a plurality of through holes horizontally elongated in section, said vertical and horizontal elongated through holes are perpendicular to said insertion direction, and said vertical elongated through holes are disposed to partially overlap with said horizontally elongated through holes to define a plurality of rectangular openings, each of said rectangular openings preventing undesirable vertical and horizontal movements of said detection pin within the terminal accommodation chamber.

2. The connector checker set forth in claim 1 wherein said block of said checker main body is formed with said vertically elongated through holes or said horizontally elongated through holes, while a plate is formed with said horizontally elongated through holes or said vertically elongated through holes, said vertically elongated through holes being parallel with each other, said horizontally elongated through holes being parallel with each other, said plate being mounted on a surface of said block to define said rectangular openings.

3. The connector checker set forth in claim 2 wherein the elongated holes of said block are separated from each other by partition walls, while the elongated holes of said plate are separated by partition walls, the partition walls of said block being disposed to abut against and be perpendicular to the partition walls of said plate to define the plurality of said rectangular openings.

* * * * *